US012625192B2

(12) United States Patent
Park et al.

(10) Patent No.: US 12,625,192 B2
(45) Date of Patent: May 12, 2026

(54) DEVICE, SYSTEM, AND METHOD FOR PERFORMANCE ESTIMATION OF RECHARGEABLE BATTERY

(71) Applicant: LG ENERGY SOLUTION, LTD., Seoul (KR)

(72) Inventors: Ji Hye Park, Daejeon (KR); Wontae Joe, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 452 days.

(21) Appl. No.: 17/922,733

(22) PCT Filed: Jul. 27, 2021

(86) PCT No.: PCT/KR2021/009685
§ 371 (c)(1),
(2) Date: Nov. 1, 2022

(87) PCT Pub. No.: WO2022/071651
PCT Pub. Date: Apr. 7, 2022

(65) Prior Publication Data
US 2023/0341467 A1 Oct. 26, 2023

(30) Foreign Application Priority Data

Sep. 29, 2020 (KR) ........................ 10-2020-0126848

(51) Int. Cl.
*G01R 31/389* (2019.01)
*G01R 31/3842* (2019.01)
*G01R 31/388* (2019.01)

(52) U.S. Cl.
CPC ....... *G01R 31/389* (2019.01); *G01R 31/3842* (2019.01); *G01R 31/388* (2019.01)

(58) Field of Classification Search
CPC ........................ G01R 31/389; G01R 31/3842; G01R 31/388; G01R 31/385; G01R 31/392;
(Continued)

(56) References Cited

U.S. PATENT DOCUMENTS 5,672,951 A * 9/1997 Shiota ................. H02J 7/00714
320/132
6,064,182 A 5/2000 Eguchi
(Continued)

FOREIGN PATENT DOCUMENTS

CN 1320286 A 10/2001
CN 102064571 A 5/2011
(Continued)

OTHER PUBLICATIONS

Extended European Search Report for European Application No. 21875926.4, dated Oct. 16, 2023.
(Continued)

*Primary Examiner* — Catherine T. Rastovski
*Assistant Examiner* — Lal Ce Mang
(74) *Attorney, Agent, or Firm* — Birch, Stewart, Kolasch & Birch, LLP

(57) ABSTRACT

Discussed are a device, a system and a method for estimating a performance of a rechargeable battery. The device can include a current sensor to measure a discharge current output from a rechargeable battery during a discharge period in which the rechargeable battery is discharged from a predetermined reference voltage with a constant voltage, and a control circuit to calculate a resistance change relationship depending on a State of Charge (SOC) change during the discharge period based on the predetermined reference voltage and a change of the discharge current depending on time passage.

15 Claims, 13 Drawing Sheets

(58) Field of Classification Search
CPC .............. G01R 31/3648; G01R 31/382; G01R 19/0038; G01R 19/12; G01R 27/08; H01M 2010/4271; H01M 10/42; H01M 10/44; H01M 10/48; Y02E 60/10; H02J 7/00712; H02J 7/007
See application file for complete search history.

(56) References Cited

U.S. PATENT DOCUMENTS

| | | | | |
|---|---|---|---|---|
| 10,094,882 | B2 * | 10/2018 | Kawai | G01R 31/367 |
| 2001/0028238 | A1 * | 10/2001 | Nakamura | H01M 10/4242 |
| | | | | 320/132 |
| 2001/0033169 | A1 | 10/2001 | Singh et al. | |
| 2001/0049646 | A1 | 12/2001 | Wilkinson | |
| 2005/0214633 | A1 | 9/2005 | Nakamura et al. | |
| 2007/0096743 | A1 | 5/2007 | Arai et al. | |
| 2011/0109273 | A1 * | 5/2011 | Tamezane | B60L 58/15 |
| | | | | 320/132 |
| 2011/0260691 | A1 * | 10/2011 | Ishibashi | H02J 7/0063 |
| | | | | 320/134 |
| 2014/0222358 | A1 * | 8/2014 | Morita | G01R 31/396 |
| | | | | 702/63 |
| 2017/0331162 | A1 * | 11/2017 | Clarke | H01M 10/4285 |
| 2018/0080996 | A1 * | 3/2018 | Yamafuku | H02J 7/0013 |
| 2018/0196107 | A1 | 7/2018 | Fleischer et al. | |
| 2018/0267107 | A1 | 9/2018 | Iida et al. | |
| 2019/0271745 | A1 * | 9/2019 | Sun | G01R 31/36 |
| 2021/0103002 | A1 | 4/2021 | Li et al. | |

FOREIGN PATENT DOCUMENTS

| | | | | | |
|---|---|---|---|---|---|
| CN | 106443474 | A | 2/2017 | | |
| CN | 107408741 | A | 11/2017 | | |
| CN | 108196191 | A | 6/2018 | | |
| CN | 109031135 | A | * 12/2018 | ............ | G01R 31/36 |
| CN | 110217108 | A | 9/2019 | | |
| CN | 110687468 | A | 1/2020 | | |
| JP | 11-7984 | A | 1/1999 | | |
| JP | 2004134129 | A | * 4/2004 | ............ | Y02E 60/10 |
| JP | 2007035516 | A | * 2/2007 | ............ | H01M 8/04 |
| JP | 2007-179968 | A | 7/2007 | | |
| JP | 5393182 | B2 | 1/2014 | | |
| JP | 2014-149280 | A | 8/2014 | | |
| JP | 6377959 | B2 | 8/2018 | | |
| JP | 6382663 | B2 | 8/2018 | | |
| JP | 2020-46365 | A | 3/2020 | | |
| KR | 10-2007-0020322 | A | 2/2007 | | |
| KR | 10-2018-0028467 | A | 3/2018 | | |
| KR | 10-2018-0058057 | A | 5/2018 | | |
| WO | WO 01/51947 | A1 | 7/2001 | | |
| WO | WO 2018/129280 | A1 | 8/2016 | | |

OTHER PUBLICATIONS

International Search Report for PCT/KR2021/009685 (PCT/ISA/210) mailed on Nov. 10, 2021.

* cited by examiner

FIG. 4

DEVICE, SYSTEM, AND METHOD FOR PERFORMANCE ESTIMATION OF RECHARGEABLE BATTERY

CROSS-REFERENCE TO RELATED APPLICATION

Technical Field

This application claims priority to and the benefit of Korean Patent Application No. 10-2020-0126848 filed in the Korean Intellectual Property Office on Sep. 29, 2020, the entire contents of which are incorporated herein by reference.

The present invention relates to a device, a system, and a method for estimating performance of a rechargeable battery.

Background Art

As a demand for lithium rechargeable batteries changes from small portable electronic devices to medium and large electric vehicles (EVs) and energy storage systems (ESSs), the required battery characteristics are also significantly changing. As well as significantly strengthened requirements such as a long-term reliability of more than 10 years, safety of a pack level, and price competitiveness security compared to existing small batteries, a high power characteristic and fast charging performance are also required.

Recently, there have been attempts to improve output by improving a movement speed of electrons or improving a movement speed of ions. For example, there are various attempts such as research on technology to increase conductivity to improve the movement speed of the electrons, or adding new materials to improve the movement speed of the ions (Li+). What is required, accompanying this, is a method of measuring or estimating how much output of the rechargeable battery has improved by improving the movement speed of the electrons or the ions (Li+).

However, in order to measure output of the rechargeable battery, since the voltage and the current must be simultaneously measured and controlled, it is much more difficult than measuring the capacity of a conventional unit battery cell. In addition, it has been pointed out as a problem because the measured value tends to vary greatly depending on the measurement conditions such as an output holding time, a state-of-charge (SOC), a cut-off condition, and a measurement temperature, as well as the selection of the method for measuring the output of the rechargeable battery.

Therefore, there is a need for a method that can easily and accurately estimate how much the output performance or the rapid charging performance of the rechargeable battery has improved due to the improvement of the movement speed of the ions.

DISCLOSURE

Technical Problem

The present invention provides a device, a system, and a method for a performance estimation of a rechargeable battery for estimating the output improvement of the rechargeable battery according to the improvement of the movement speed of the ion based on a polarization resistance (Rpola), which is a resistance caused by the movement of the ions.

The present invention provides a device, a system, and a method for a performance estimation of a rechargeable battery for discharging the rechargeable battery with a constant current (CC) mode and a constant voltage (CV) mode and quantifying the polarization resistance (Rpola) based on the discharge current output from the rechargeable battery in the constant voltage (CV) mode.

The present invention provides a device, a system, and a method for a performance estimation of a rechargeable battery for determining that the rechargeable battery to be verified exceeds a predetermined output performance if the polarization resistance (Rpola) value is less than a predetermined reference value.

Technical Method

A device of the present invention includes: a current sensor to measure a discharge current output from a rechargeable battery during a discharge period in which the rechargeable battery is discharged from a predetermined reference voltage with a constant voltage; and a control circuit to calculate a resistance change relationship depending on a State of Charge (SOC) change during the discharge period based on the predetermined reference voltage and a change of the discharge current depending on time passage, wherein the control unit calculates a resistance value of each of a first resistance as a resistance due to a voltage drop of the rechargeable battery, a second resistance as a resistance generated as an ion is inserted into an active material of the rechargeable battery during the discharge period, and a third resistance as a polarization resistance generated by a movement of the ion in the rechargeable battery, based on the resistance change relationship according to the SOC change of the discharge period.

The control unit, in a resistance change relationship depending on the SOC change during the discharge period, may use a resistance value of a starting point of the discharge period as a resistance value for the first resistance, calculate a resistance value at an end point of the discharge period as an upper limit value of the second resistance on an extending line connecting a first point corresponding to the resistance value of the discharge period and a second point where a resistance change ratio for the SOC change exceeds a first reference value in the resistance change relationship for the SOC change, and calculate a resistance value of the second resistance based on a difference of an upper limit value of the second resistance and the resistance value of the first resistance.

The control circuit may calculate the resistance value of the third resistance based on a difference of the resistance value of the end point of the discharge period and the upper limit value of the second resistance.

The control circuit may compare the resistance value of the third resistance with a second reference value to determine an output performance of the rechargeable battery.

A voltage sensor for measuring a voltage of the rechargeable battery to be transmitted to the control unit may be further included.

A system of the present invention includes: a discharger to discharge a rechargeable battery from a predetermined reference voltage with a constant voltage; a current sensor to measure the discharge current output from the rechargeable battery during a discharge period during which the rechargeable battery is discharged; and a control circuit to calculate a resistance change relationship depending on a State of Charge (SOC) change during the discharge period based on the predetermined reference voltage and a change of the discharge current depending on time passage, wherein the control circuit calculates a resistance value of each of a first resistance as a resistance due to a voltage drop of the rechargeable battery, a second resistance as a resistance generated as an ion is inserted into an active material of the rechargeable battery during the discharge period, and a third resistance as a polarization resistance generated by a movement of the ion in the rechargeable battery, based on the resistance change relationship according to the SOC change of the discharge period.

The control unit, in a resistance change relationship depending on the SOC change during the discharge period, may use a resistance value of a starting point of the discharge period as a resistance value for the first resistance, calculate a resistance value at an end point of the discharge period as an upper limit value of the second resistance on an extending line connecting a first point corresponding to the resistance value of the discharge period and a second point where a resistance change ratio for the SOC change exceeds a first reference value in the resistance change relationship for the SOC change, and calculate a resistance value of the second resistance based on a difference of an upper limit value of the second resistance and the resistance value of the first resistance.

The control circuit may calculate the resistance value of the third resistance based on a difference of the resistance value of the end point of the discharge period and the upper limit value of the second resistance.

The discharger may discharge the rechargeable battery with a predetermined constant current under a control of the control circuit to lower a voltage of the rechargeable battery to correspond to the predetermined reference voltage.

A method of the present invention includes: controlling a rechargeable battery to be discharged from a predetermined reference voltage with a constant voltage; receiving a measuring value of a discharge current output from the rechargeable battery during a discharge period in which the rechargeable battery is discharged; calculating a resistance change relationship depending on a State of Charge (SOC) change during the discharge period based on the predetermined reference voltage and a change of the discharge current according to time passage; and calculating each resistance value of a first resistance as a resistance due to a voltage drop of the rechargeable battery, a second resistance as a resistance generated as an ion is inserted in an active material of the rechargeable battery during the discharge period, and a third resistance as a polarization resistance generated by a movement of the ion in the rechargeable battery, based on the resistance change relationship depending on the SOC change during the discharge period.

The calculating of the resistance value may include: calculating a resistance value of a starting point of the discharge period as a resistance value for the first resistance; calculating the resistance value at the end point of the discharge period as an upper limit value of the second resistance and calculating a resistance value of the second resistance based on a difference of the upper limit value of the second resistance and the resistance value of the first resistance on an extending line connecting a first point corresponding to the resistance value of the staring point of the discharge period and a second point where the resistance change ratio for the SOC change exceeds a first reference value on the resistance change relationship for the SOC change; and calculating a resistance value of the third resistance based on a resistance value of the end point of the discharge period and the upper limit value of the second resistance.

Advantageous Effects

The present invention may easily determine whether the rechargeable battery to be verified in a research and production stage of the rechargeable battery passes predetermined output performance with a numerical polarization resistance (Rpola) value.

DESCRIPTION OF THE DRAWINGS

FIG. 4 is a graph converting a current-time graph of FIG. 3 into a resistance-SOC (State of Charge) graph.

MODE FOR INVENTION

Figure 1:
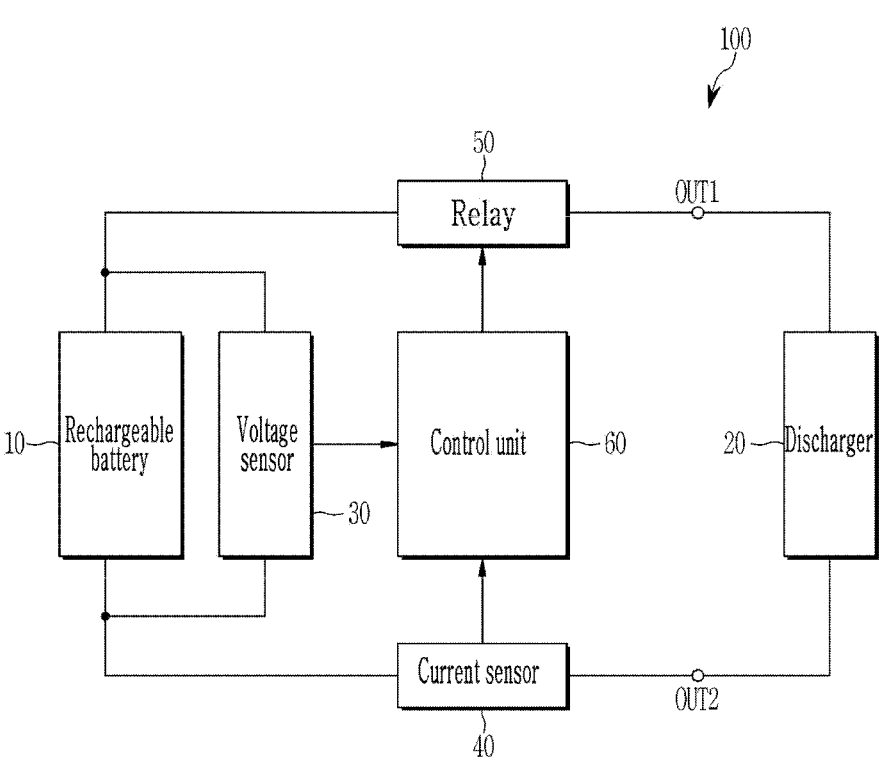
FIG. 1 is a view explaining a system for estimating a performance of a rechargeable battery according to an exemplary embodiment.

Hereinafter, exemplary embodiments disclosed in the present specification will be described in detail with reference to the accompanying drawings. In the present specification, the same or similar components will be denoted by the same or similar reference numerals, and an overlapped description thereof will be omitted. The terms "module" and "unit" for components used in the following description are used only in order to easily make a specification. Therefore, these terms do not have meanings or roles that distinguish then from each other in themselves. Further, in describing exemplary embodiments of the present specification, when it is determined that a detailed description of the well-known art associated with the present invention may obscure the gist of the present invention, it will be omitted. In addition, the accompanying drawings are provided only in order to allow exemplary embodiments disclosed in the present specification to be easily understood and are not to be interpreted as limiting the spirit disclosed in the present specification, and it is to be understood that the present invention includes all modifications, equivalents, and substitutions without departing from the scope and spirit of the present invention.

Terms including ordinal numbers such as first, second, and the like will be used only to describe various components, and are not to be interpreted as limiting these components. The terms are only used to differentiate one component from other components.

It is to be understood that when one component is referred to as being "connected" or "coupled" to another component, it may be connected or coupled directly to another component or be connected or coupled to another component with the other component intervening therebetween. On the other hand, it is to be understood that when one component is referred to as being "connected or coupled directly" to another component, it may be connected to or coupled to another component without another component intervening therebetween.

It will be further understood that terms "comprise" or "have" used in the present specification specify the presence of stated features, numerals, steps, operations, components, parts, or a combination thereof, but do not preclude the presence or addition of one or more other features, numerals, steps, operations, components, parts, or a combination thereof.

FIG. 1 is a view explaining a system estimating a performance of a rechargeable battery according to an exemplary embodiment.

Referring to FIG. 1, a performance estimation system 100 of a rechargeable battery may include a rechargeable battery 10, a discharger 20, a voltage sensor 30, a current sensor 40, a relay 50, and a control unit (or a control circuit) 60.

The rechargeable battery 10 is a battery composed of at least one electrochemical cell that can be repeatedly charged and discharged. Hereinafter, the rechargeable battery 10 is described as a lithium ion (Li-ion) rechargeable battery that produces electricity by a chemical reaction of lithium, but is not limited thereto, and it may include a rechargeable battery that may be repeatedly charged and discharged such as a nickel-cadmium (Ni—Cd) battery, a nickel hydrogen (NiMH) battery, etc.

The rechargeable battery may be composed of a positive electrode (an anode, a negative electrode (a cathode), an electrolyte solution, and a separator.

The positive electrode may be coated with a mixture in which a positive active material, a conductive agent, and a binder are mixed on a thin aluminum base material that holds a frame of the positive electrode. The positive active material is a material containing lithium ion (Li+), which is unstable in an elemental state, such as lithium oxide in which lithium is combined with oxygen. That is, the positive active material provides lithium ions (Li$^+$) during charging, and is a material involved in the electrode reaction of the actual battery. The conductive agent functions to increase the conductivity of the positive active material with low electrical conductivity. The binder acts as a kind of an adhesive that helps the active material and the conductive agent to settle well on the aluminum base material.

For the negative electrode, a negative active material, a conductive agent, and a binder are coated on a copper base material. The negative active material stores lithium ions (Li$^+$) during the charging, and graphite with a stable structure is mainly used. Graphite has many conditions that the negative active material must have: structural stability, low electrochemical reactivity, and the ability to store a lot of lithium ions (Li$^+$). The negative active material allows the current to flow through the external circuit, while reversibly absorbing and releasing lithium ions (Li$^+$) discharged from the positive electrode The electrolyte solution is a medium that allows lithium ions (Li$^+$) to move between the positive and negative electrodes. As the electrolyte solution, a material with high ion conductivity may be used to move lithium ions (Li) well.

The electrolyte solution may consist of salts, solvents, and additives. The salt is a passage through which lithium ion (Li+) can pass, the solvent is an organic liquid used to dissolve the salt, and the additive is a material added in a small amount for a specific purpose.

The separator is a porous polymer film that physically blocks the positive and negative electrodes from contacting each other. Also, lithium ions (Li$^+$) may move through the pores formed in the separator. For example, if the positive electrode and the negative electrode are in direct contact, the battery may be short-circuited or explode.

The performance required for the rechargeable battery 10 varies depending on the environment in which it is used. For example, the output performance of the rechargeable battery 10 is the ability to provide the electrical energy for a unit time. For example, the electrical energy required for executing an image is greater than the electrical energy required for executing a phone call on a smartphone, and at this time, the output of the rechargeable battery 10 that provides the electrical energy to the smartphone is also determined accordingly. For example, if the movement speed of the electrons is improved or the movement speed of the lithium ion (Li$^+$) is improved, the output that the rechargeable battery 10 may provide may also be improved.

The discharger 20, in order to estimate the output performance or the fast charging performance of the rechargeable battery 10, after discharging the rechargeable battery 10 with a constant current (CC), may discharge it from a predetermined reference voltage with a constant voltage (CV). The discharger 20 may discharge the rechargeable battery 10 under the control of the control unit 60, but is not limited thereto, and may discharge the rechargeable battery 10 according to a predetermined step by including an independent discharge circuit, a current sensor, and a voltage sensor.

At this time, the reference voltage, which is an inflection point for changing the discharge mode from the constant current (CC) mode to the constant voltage (CV) mode, may be set to a voltage value at which the polarization resistance generated by the movement of lithium ions (Li$^+$) is well observed or a voltage value corresponding to the SOC (State of Charge) for which the output performance is to be checked. In addition, the discharger 20 may terminate the discharge of the rechargeable battery 10 when the SOC of the rechargeable battery 10 reaches a predetermined SOC value.

The voltage sensor 30 may measure the voltage of the rechargeable battery 10 at a predetermined time interval or in real time and transmit it to the control unit 60.

The current sensor 40 may measure the discharge current that is a current output from the rechargeable battery 10 and transmit it to the control unit 60. According to an exemplary embodiment, the current sensor 40 may measure the discharge current which is the current output from the rechargeable battery 10 in the predetermined time interval or in real time during the discharge period in which the rechargeable battery 10 is discharged from the predetermined reference voltage with the constant voltage (CV) to be transmitted to the control unit 60.

The relay 50 electrically connects or disconnects the rechargeable battery 10 and the discharger 20 under the control of the control unit 60. For example, the control unit 60 may transmit a control signal for turning on the relay 50 to connect the rechargeable battery 10 and the discharger 20, thereby continuously discharging the rechargeable battery 10 for a predetermined time.

The control unit 60 calculates a resistance change relationship depending on the State of Charge (SOC) change during the discharge period based on the change of the discharge current according to the reference voltage and time passage. Also, the control unit 60 may calculate, based on the resistance change relationship depending on the state of charge (SOC) change during the discharge period, each resistance of a first resistance of a resistance depending on the electric characteristic of the rechargeable battery 10, a second resistance of a resistance generated depending on the insertion of the lithium ions (Li$^+$) into the active material of the rechargeable battery during the discharge period, and a third resistance of the polarization resistance generated by the movement of lithium ions (Li$^+$) in the rechargeable battery 10. For a more detailed description, it will be explained together in FIG. 2 to FIG. 5.

Figure 2:
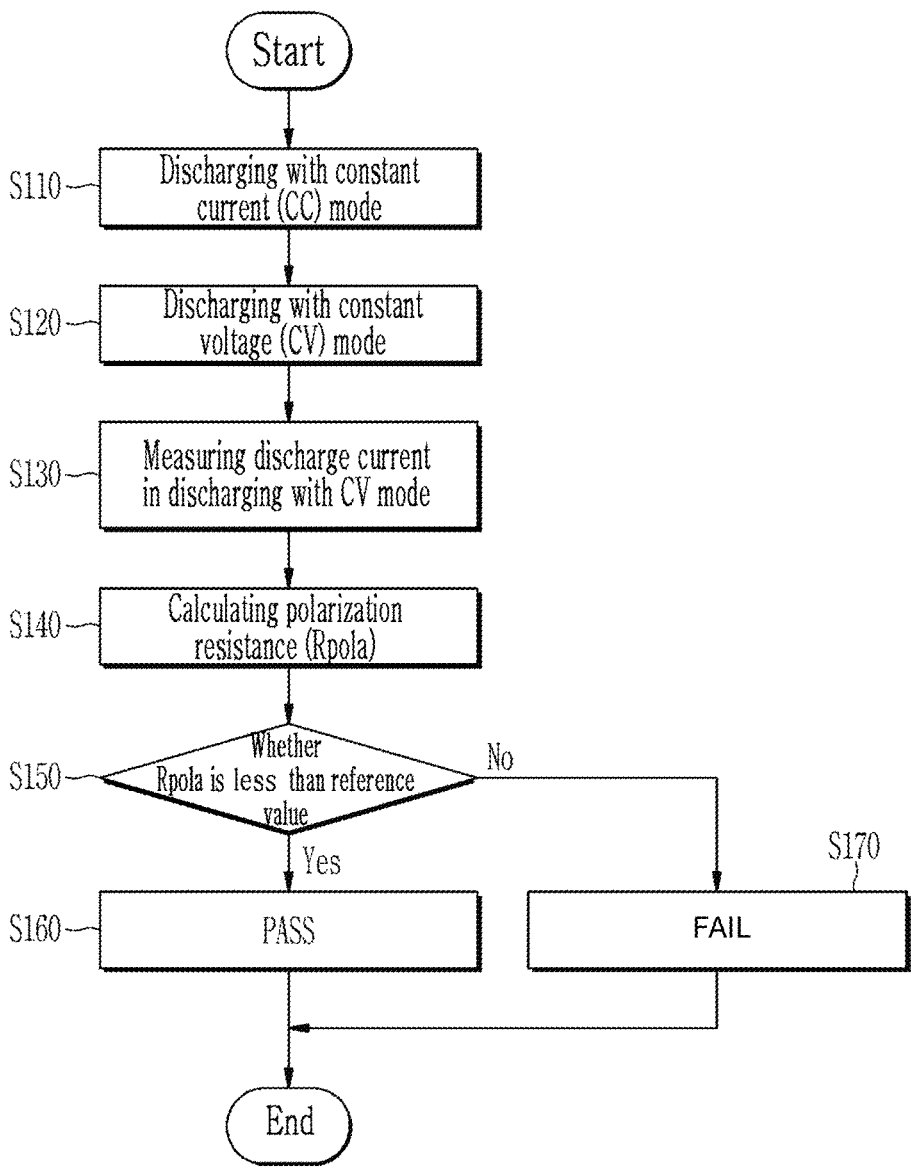
FIG. 2 is a flowchart explaining a method for estimating performance of a rechargeable battery according to an exemplary embodiment.
Figure 3:
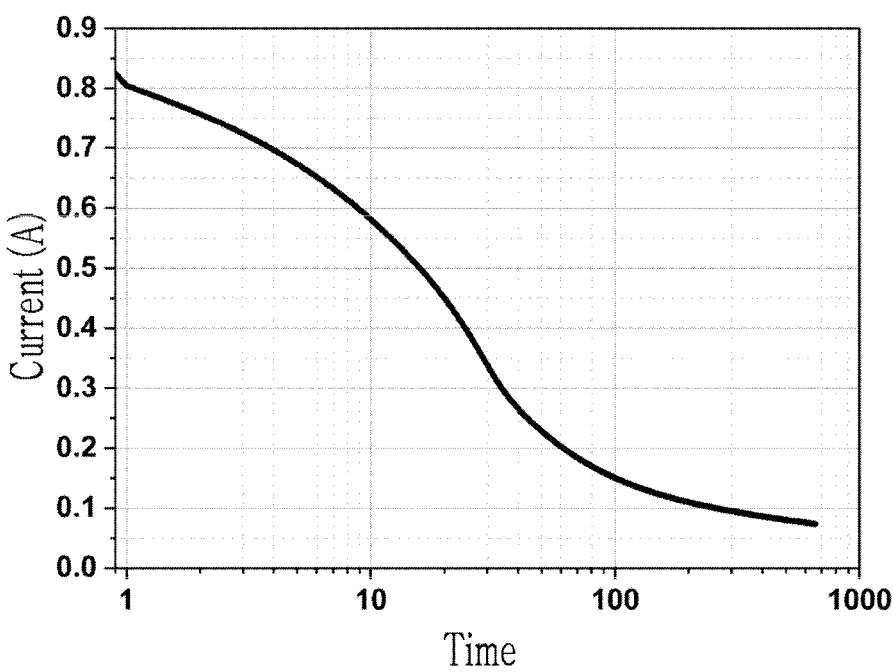
FIG. 3 is a graph showing a discharge current measured while discharging a rechargeable battery with a constant voltage (CV).
Figure 4:
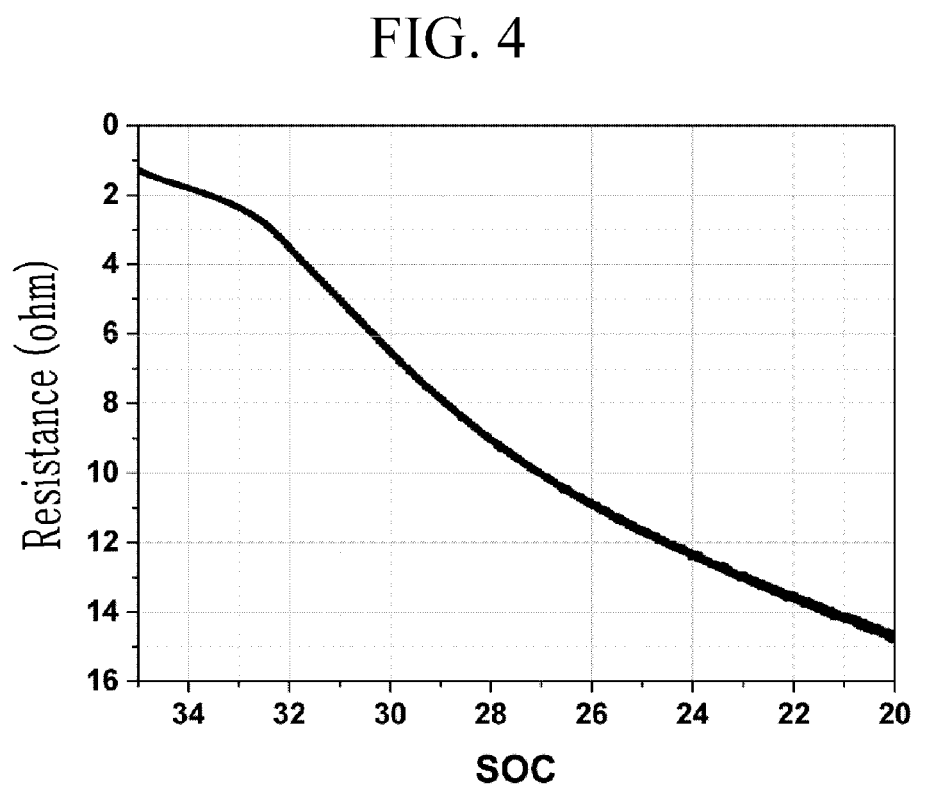
Figure 5:
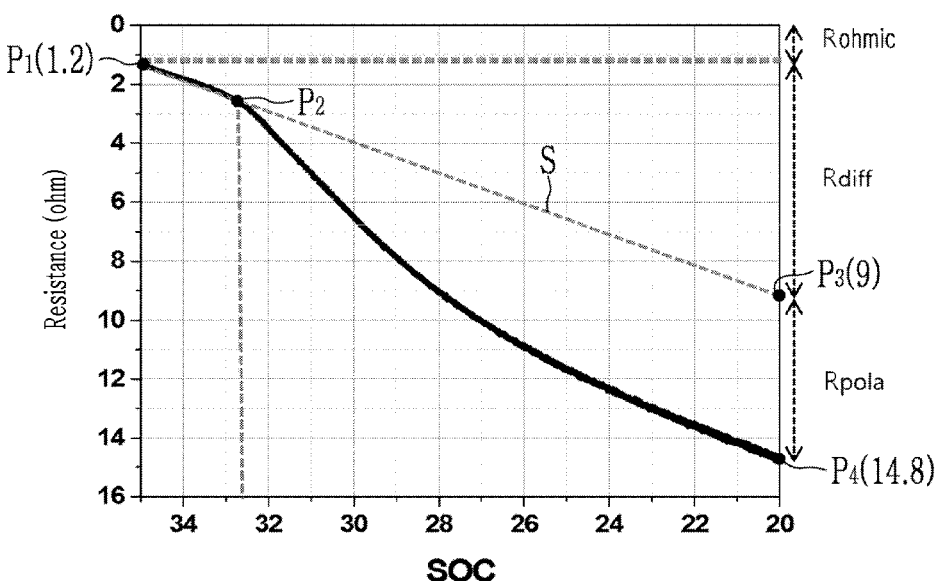
FIG. 5 is a view explaining a method to calculate a polarization resistance (Rpola) in a graph of FIG. 4.

FIG. 2 is a flowchart explaining a method for estimating performance of a rechargeable battery according to an exemplary embodiment, FIG. 3 is a graph showing a discharge current measured while discharging a rechargeable battery with a constant voltage (CV), FIG. 4 is a graph converting a current-time graph of FIG. 3 into a resistance-SOC (State of Charge) graph, and FIG. 5 is a view explaining a method to calculate a polarization resistance (Rpola) in a graph of FIG. 4.

Referring to FIG. 2, first, the control unit 60 controls the discharger 20 to discharge the rechargeable battery 10 with the constant current (CC) so that the voltage of the rechargeable battery 10 decreases to a predetermined reference voltage (S110).

For example, if the movement speed of lithium ions (Li$^+$) is improved by changing the positive electrode additive, the porosity of the positive electrode, the negative active material, etc., the output of the rechargeable battery 10 is also improved. When the rechargeable battery 10 is continuously discharged for a predetermined time and the state of charge (SOC) of the rechargeable battery 10 decreases and reaches a specific value (e.g., SOC 30%, etc.), a section in which the output performance rapidly decreases may occur. At this time, the researcher and the like may want to check how much the output performance of the rechargeable battery 10 is improved in the corresponding section by changing the positive electrode additive, the porosity of the positive electrode, the negative active material, and the like. At this time, the starting point of the section may be set as the state of charge (SOC) of the rechargeable battery 10. Also, the voltage value corresponding to the state of charge (SOC) may be set as the reference voltage.

Next, the control unit 60 controls the discharger 20 to discharge the rechargeable battery 10 with the constant voltage (CV) (S120).

According to an exemplary embodiment, the control unit 60 may set a discharge section for discharging the rechargeable battery 10 with the constant voltage (CV) based on the state of charge (SOC) of the rechargeable battery 10. For example, the control unit 60, when the real time state of charge (SOC) of the rechargeable battery 10 reaches the first state of charge (SOC) (e.g., SOC 35%), controls the discharger 20 so that the discharge with the constant voltage (CV) of the rechargeable battery 10 starts. In addition, the control unit 60, when the real time state of charge (SOC) of the rechargeable battery 10 reaches the second state of charge (SOC) (e.g., SOC 20%), controls the discharger 20 so that the constant voltage (CV) discharge of the rechargeable battery 10 is shut down. That is, the control unit 60 may discharge the rechargeable battery 10 with the constant voltage (CV) in the discharge section in which the starting point is set as the SOC 35% and the end point as the SOC 20%. At this time, the time corresponding to the discharge section is defined as a discharge period.

Next, the control unit 60 receives the measured value of the discharge current output from the rechargeable battery during the discharge period from the current sensor (S130).

According to an exemplary embodiment, the current sensor 40 measures the discharge current of the current output from the rechargeable battery 10 in a predetermined time interval or in real time to be transmitted to the control unit 60 during the discharge period in which the rechargeable battery 10 is discharged from the predetermined reference voltage with the constant voltage (CV).

FIG. 3 shows the discharge current according to the time passage calculated in the experimental condition where the discharge with the constant voltage (CV) of the rechargeable battery 10 starts when the state of charge (SOC) is 35% and the reference voltage is 2.5 V, and the discharge of the rechargeable battery 10 is finished when the state of charge (SOC) reaches 20%. The control unit 60 may calculate the measured value of the discharge current received from the current sensor with the graph as shown in FIG. 3.

Next, the control unit 60 calculates the polarization resistance Rpola generated by the movement of lithium ions (Li$^+$) based on the discharge current according to the time passage (S140).

According to an exemplary embodiment, if the rechargeable battery 10 is discharged with the constant voltage CV, that is, discharged while maintaining the voltage to be constant, the current change as shown in FIG. 3 may be observed. Also, the control unit 60, during the discharge period, may estimate the SOC at each point in the graph of FIG. 3. Due to the constant voltage CV discharge, since the voltage is constant, the current change depending on the time passage may be checked in FIG. 3 and the SOC value corresponding to each time may be known, and the control unit 60 may derive a resistance change relationship according to the SOC change during the discharge period. For example, the control unit 60 may calculate the resistance change relationship according to the SOC change during the discharge period based on FIG. 3 with the graph as shown in FIG. 4.

FIG. 5 is a drawing showing the method for calculating the polarization resistance Rpola in the graph shown in FIG. 4. First, the control unit 60, based on the resistance change relationship depending on the SOC change during the discharge period, may calculate the resistance value of a first resistance Rohmic of a resistance due to the voltage drop of the rechargeable battery 10. The resistance of the first resistance Rohmic corresponds to a sum value of resistance values of an electrical resistance Rohm derived depending on an electrical characteristic of the rechargeable battery 10, a charge transfer resistance Rct, and a resistance Rocv by an open circuit voltage (OCV).

For example, the first resistance Rohmic, when the rechargeable battery 10 is discharged with the constant voltage CV, may be expressed within about 0.1 seconds. Accordingly, the control unit 60, in the graph of FIG. 5, may use the resistance value developed at the time of the discharge period, more precisely, after 0.1 second from the time, as the resistance value to the first resistance Rohmic.

The control unit 60 calculates a second resistance (Rdiff), which is a resistance generated as the ions are inserted into the active material of the rechargeable battery 10. In addition, the second resistance Rdiff, in other words, may be defined as a resistance Rdiff by the diffusion of the electrolyte.

Referring to FIG. 5, the control unit 60 may calculate the resistance (e.g., 9 ohm) at the end point P3 of the discharge period as an upper limit value of the second resistance Rdiff on an extending line S connecting a first point P1 corresponding to the resistance of the time of the discharge period and a second point P2 at which a resistance change ratio for the SOC change exceeds a first reference value in the resistance change relationship for the SOC change. The control unit 60 may calculate the resistance (e.g., 7.8 ohm) for the second resistance Rdiff based on the difference (9−1.2=7.8 ohm) of the upper limit value of the second resistance Rdiff and the resistance (e.g., 1.2 ohm) of the first resistance Rohmic. Here, the second point P2 may be defined as a point where the change of the slope is abrupt in the resistance change relationship graph according to the SOC change, that is, the point where the slope exceeds a first predetermined reference value.

The control unit 60 calculates the third resistance Ppola, which is the polarization resistance caused by the movement of the ions in the rechargeable battery. The control unit 60, referring to FIG. 5, may calculate the resistance (e.g., 5.8 ohm) of the third resistance Ppola based on the difference (14.8−9=5.8 ohm) of the resistance (e.g., 14.8 ohm) of the end point P4 of the discharge period and the upper limit value (e.g., 9 ohm) of the second resistance.

Next, the control unit 60 compares the polarization resistance Rpola value with a reference value (S150).

According to an exemplary embodiment, if there is a performance index expected from the fully assembled rechargeable battery, the polarization resistance Rpola value corresponding to the performance index may be calculated as a reference value. Then, the control unit 60 may compare the polarization resistance Rpola value of the measured electrode with the reference value to determine whether the rechargeable battery including the electrode to be verified passes the reference performance (PASS) or does not pass (FAIL).

Next, if the polarization resistance Rpola value is less than the reference value (S150, Yes), the control unit 60 determines that the performance of the rechargeable battery including the corresponding electrode passes the performance index expected from the fully assembled rechargeable battery (PASS) (S160).

Next, if the polarization resistance Rpola value is more than the reference value (S150, No), the control unit 60 determines that the performance of the rechargeable battery including the corresponding electrode does not pass the performance index expected from the fully assembled rechargeable battery (FAIL) (S170).

FIG. 6 to FIG. 16 are experimental results showing a correlation between a polarization resistance Rpola and an output performance.

Figure 6:
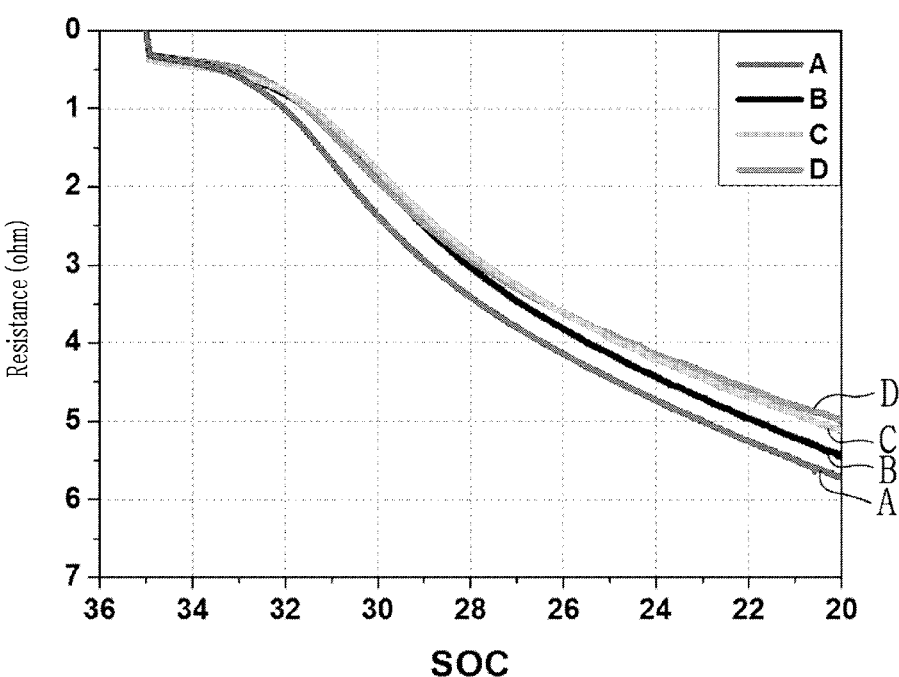
FIG. 6 and FIG. 7 are graphs showing experimental results to compare performance of a rechargeable battery at room temperature and a low temperature.
Figure 7:
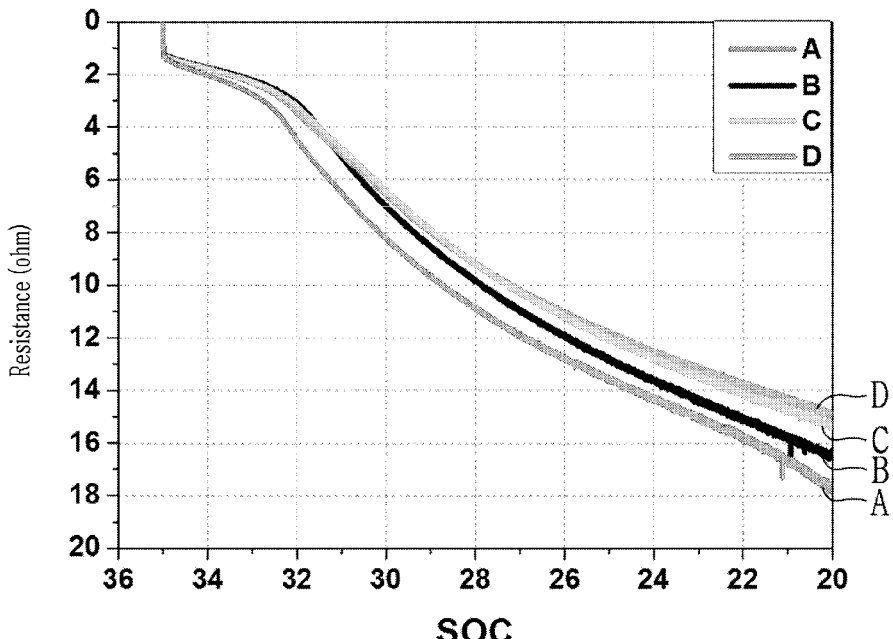

FIG. 6 and FIG. 7 show the experimental results to compare the performance of the rechargeable battery at room temperature and a low temperature.

FIG. 6 is derived by performing a discharge test on each of a plurality of electrodes A, B, C, and D) with a constant voltage CV at room temperature (e.g., 25° C.) and a predetermined starting condition (15 C and 2.5 V), and displays a resistance change relationship according to the SOC change the during discharge period. FIG. 7 is derived by performing a discharge test on each of a plurality of electrodes A, B, C, and D) with a constant voltage CV at low temperature (e.g., −10° C.) and a predetermined starting condition (5.5 C and 2.5 V), and displays the resistance change relationship according to the SOC change during the discharge period. A plurality of electrodes A, B, C, and D and other conditions are the same, and only the temperature and the start conditions are different, and the discharge tests are performed. The discharge test is to discharge the rechargeable battery with the constant current CC and the constant voltage CV, and to measure the discharge current output from the rechargeable battery during the discharge period, which is a period during which the rechargeable battery is discharged with the constant voltage CV.

TABLE 1

| | −10° C. 5.5 C, 2.5 V CV | | 25° C. 15 C, 2.5 V CV | |
|---|---|---|---|---|
| SET | End I (C-rate) | R (ohm) | End I (C-rate) | R (ohm) |
| A | 0.43 | 17.7 | 1.33 | 5.7 |
| B | 0.45 | 16.5 | 1.36 | 5.5 |
| C | 0.48 | 15.3 | 1.46 | 5.1 |
| D | 0.50 | 14.9 | 1.48 | 5.0 |

Table 1 displays the values of a discharge end current (End I) and a polarization resistance Rpola of a continuous discharge output of each of a plurality of electrodes A, B, C, and D calculated based on FIG. 6 and FIG. 7. Referring to Table 1, regardless of the temperature and the start condition, it may be seen that the lower the polarization resistance (Rpola) value (A>B>C>D), the higher the discharge end current (End I) value. At this time, the continuous discharge output performance of the rechargeable battery is better as the discharge end current (End I) value is higher.

Therefore, it may be confirmed that the polarization resistance (Rpola) is a factor that indicates the performance of the rechargeable battery regardless of the temperature.

Figure 8:
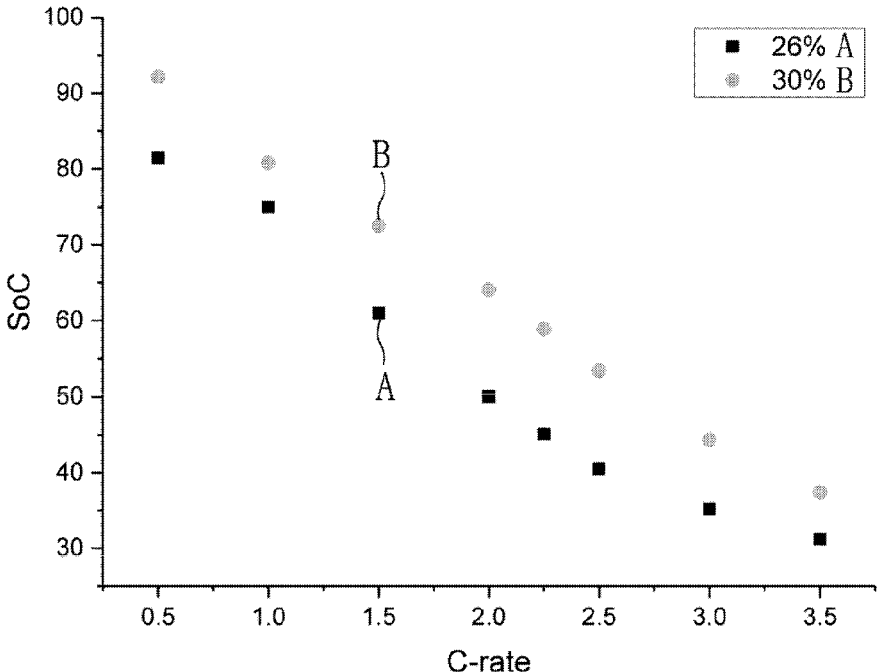
FIG. 8 and FIG. 9 are graphs comparing charging performance of a rechargeable battery based on a polarization resistance (Rpola) when porosity of a negative electrode is different.
Figure 9:
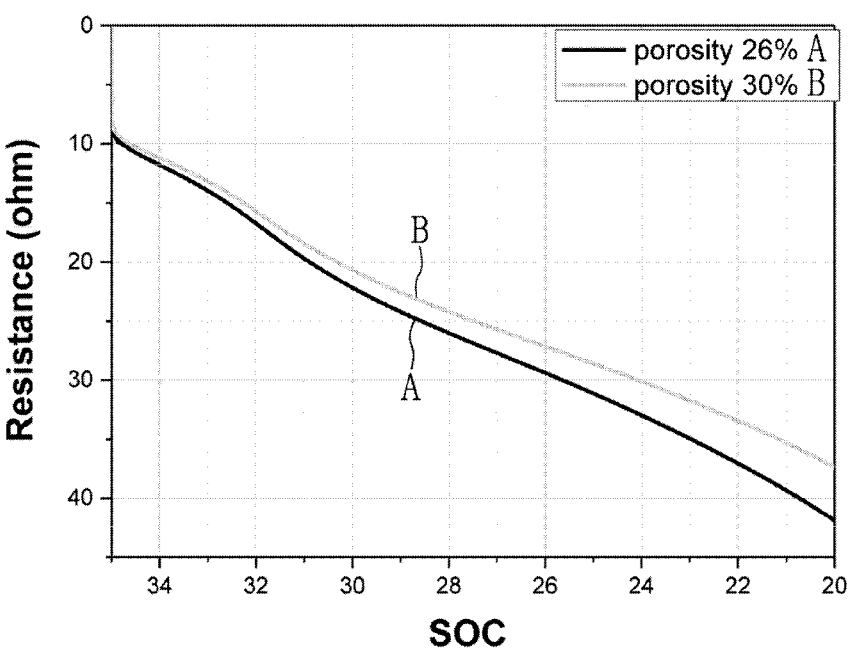

FIG. 8 and FIG. 9 are graphs comparing the charging performance of a rechargeable battery based on the polarization resistance (Rpola) when the porosity of the negative electrode is different. Specifically, FIG. 8 and FIG. 9 are exemplary diagrams showing the correlation between the polarization resistance (Rpola) and the charging termination SOC.

According to an exemplary embodiment, the quantified polarization resistance is related to the charge end SOC, which is one of the charging performance factors of the rechargeable battery. For example, if the porosity of the negative electrode is increased, the movement speed of the ions is improved and the polarization resistance is reduced, and as a result, the charge end SOC is also improved. That is, when the rechargeable battery 10 is continuously charged, the quantified polarization resistance may be used as an index predicting the performance of the charging end SOC point. The experimental results for this are as follows.

Referring to FIG. 8 and FIG. 9, the first electrode A has porosity of 26%, and the second electrode B has porosity of 30%.

TABLE 2

| Negative electrode porosity | A (26%) | B (30%) |
|---|---|---|
| Rpolar (mohm) | 2 | 3.7 |

Table 2 displays the polarization resistance Rpola values of the first electrode A and the second electrode B calculated by the method described in FIG. 5 for the graph of FIG. 9.

Referring to FIG. 8 and Table 2, it may be confirmed that the polarization resistance Rpola value of the first electrode A is smaller than the polarization resistance Rpola value of the second electrode B, and the charge end SOC value of the first electrode A is smaller than the value of the second electrode B of the charge end SOC value.

Figure 10:
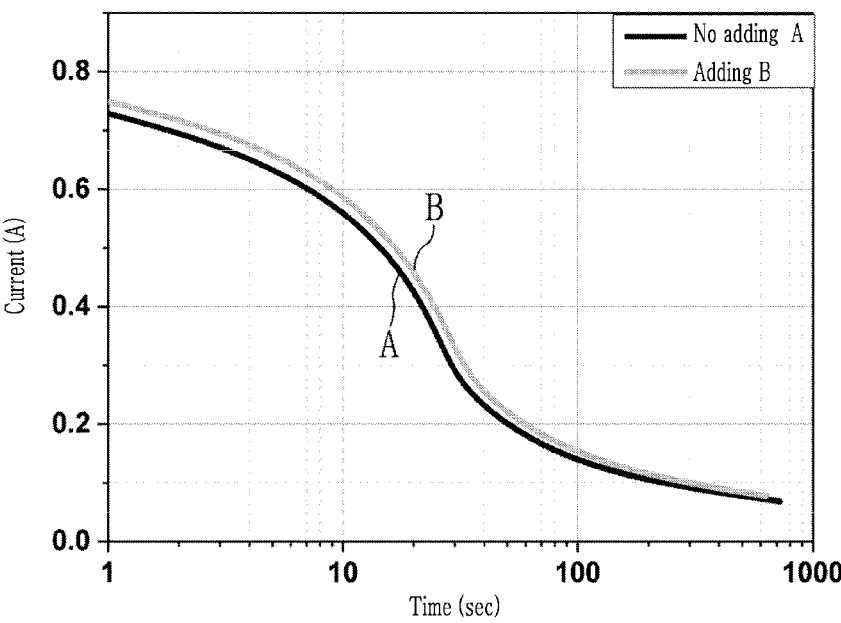
FIG. 10 and FIG. 11 are graphs comparing output performance of a rechargeable battery based on a polarization resistance (Rpola) when a positive electrode additive is different.
Figure 11:
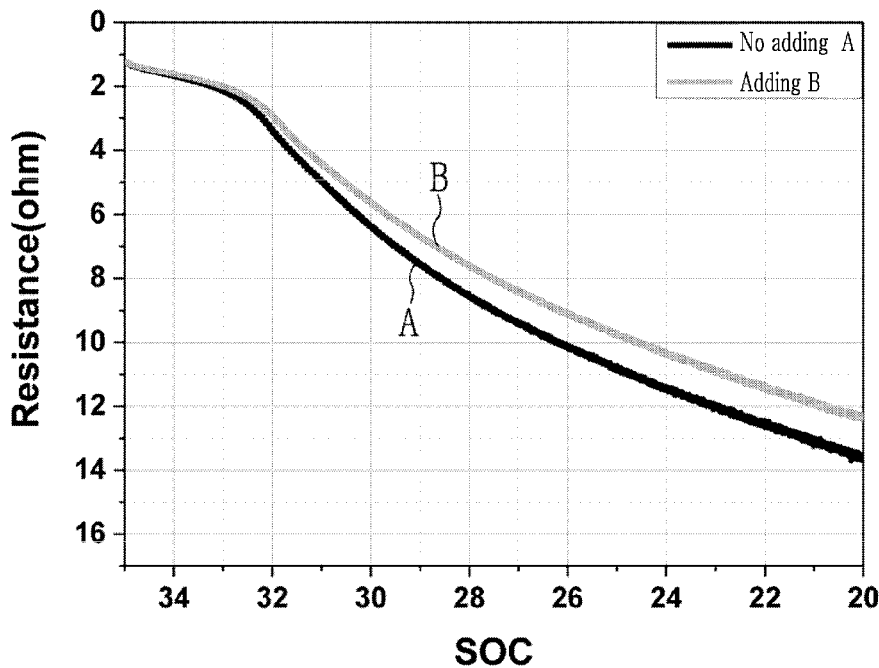

FIG. 10 and FIG. 11 are graphs comparing the output performance of the rechargeable battery based on the polarization resistance Rpola when the positive electrode additives are different. Specifically, FIG. 10 and FIG. 11 are exemplary diagrams illustrating the correlation between the polarization resistance Rpola and the discharge end current End I.

According to an exemplary embodiment, the quantified polarization resistance is related to the discharge end current End I, which is one of the output performance factors during the discharge of the rechargeable battery.

For example, if the movement speed of the ions is improved by adding the positive electrode additive, the polarization resistance is reduced, and as a result, the discharge end current (End I) is also improved. That is, when the rechargeable battery 10 is continuously discharged, the quantified polarization resistance may be used as an index for predicting the output performance at the time of the discharge end. The experimental results for this are as follows.

FIG. 10 shows the discharge current value depending on the time passage as the discharge test result for the first electrode A to which the positive electrode additive is not added and the second electrode B to which the positive electrode additive is added. FIG. 11 is a drawing showing the resistance change depending on the SOC change of the first electrode A and the second electrode B based on FIG. 10.

TABLE 3

| Negative electrode additive | | A (No adding) | B (Adding) |
|---|---|---|---|
| Current | End I | 0.51 C | 0.56 C |
| Resistance | Rohmic (ohm) | 1.35 | 1.33 |
| | Rdiff (ohm) | 5.62 | 5.13 |
| | Rpolar (ohm) | 6.62 | 5.93 |

Table 3 displays the polarization resistance (Rpola) value of the first electrode A and the second electrode B calculated by the method described in FIG. 5 for the graph of FIG. 11, and the discharge end current (End I) of the first electrode A and the second electrode B obtained by the discharge test.

Referring to Table 3, when the positive electrode additive is added to improve the conductivity of the ions, the polarization resistance (Rpola) decreases (A>B). In addition, the second electrode B having the small polarization resistance (Rpola) has higher output performance, i.e., the discharge end current (End I), than the first electrode A (A<B).

Figure 12:
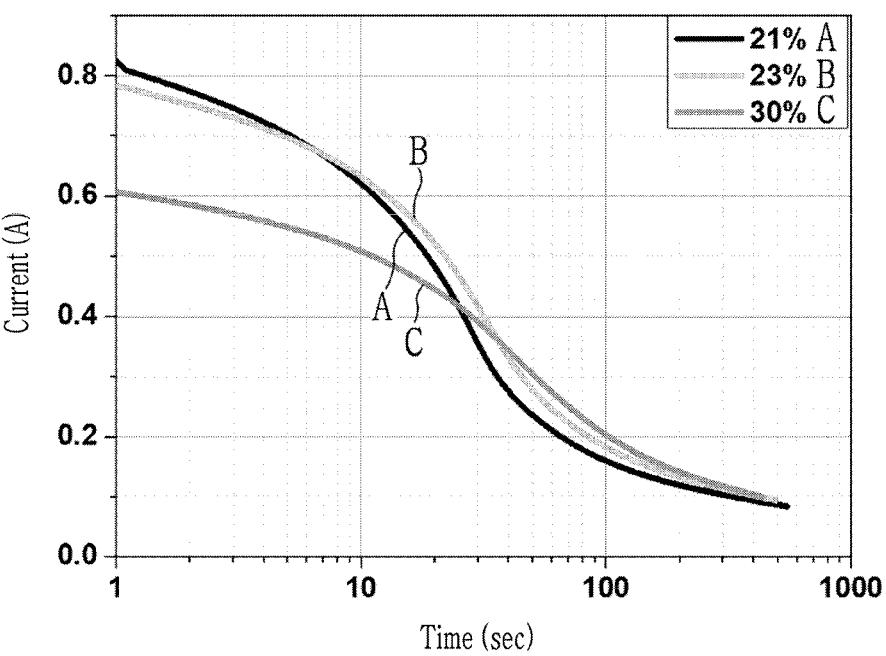
FIG. 12 and FIG. 13 are graphs comparing output performance of a rechargeable battery based on a polarization resistance (Rpola) when a porosity of a positive electrode is different.
Figure 13:
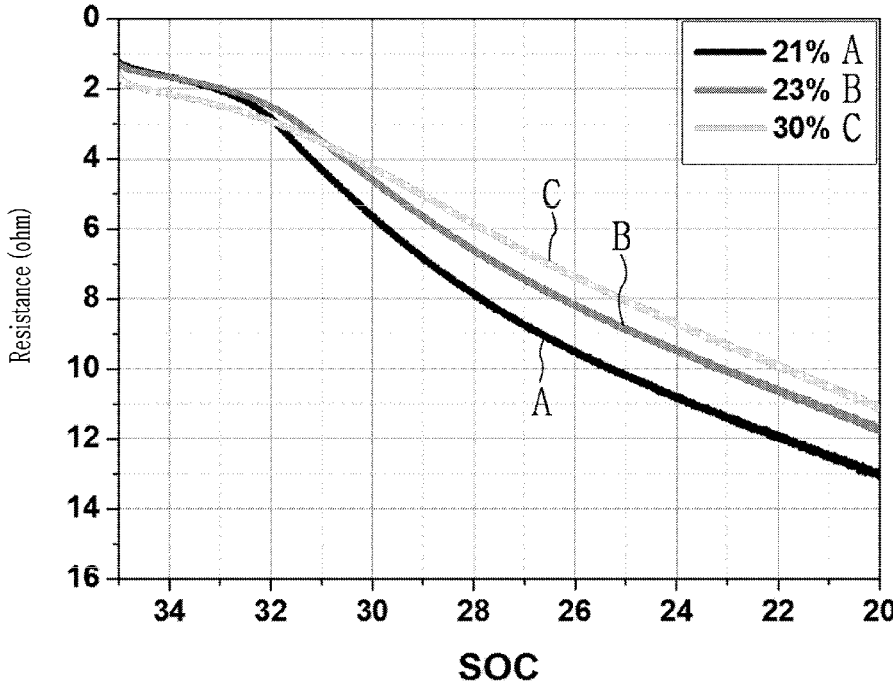

FIG. 12 and FIG. 13 are graphs comparing the output performance of the rechargeable battery based on the polarization resistance Rpola when the porosity of the positive electrode is different. Specifically, FIG. 12 and FIG. 13 are other exemplary diagrams showing the correlation between polarization resistance Rpola and the discharge end current End I.

According to an exemplary embodiment, the quantified polarization resistance is related to the discharge end current End I, which is one of the output performance factors during discharge of the rechargeable battery. For example, when the porosity of the positive electrode is increased, the movement speed of the ions is improved, and the polarization resistance is reduced, and as a result, the discharge end current End I is also improved. That is, when the rechargeable battery 10 is continuously discharged, the quantified polarization resistance may be used as an index for predicting the output performance at the time of the discharge end. The experimental results for this are as follows.

FIG. 12 shows a discharge current value according to time passage, which is a discharge test result for a plurality of electrodes A, B, and C having different porosity of the positive electrode. FIG. 13 is a drawing showing the resistance change according to the SOC change of a plurality of electrodes A, B, and C based on FIG. 12. The first electrode A has porosity of 21%, the second electrode B has porosity of 23%, and the third electrode C has porosity of 30%.

TABLE 4

| Porosity | | A (21%) | B (23%) | C (30%) |
|---|---|---|---|---|
| Current | End I | 0.57 C | 0.64 C | 0.69 C |
| Resistance | Rohmic (ohm) | 1.34 | 1.41 | 1.82 |
| | Rdiff (ohm) | 5.35 | 4.5 | 5.23 |
| | Rpolar (ohm) | 6.41 | 5.89 | 4.09 |

Table 4 displays the polarization resistance Rpola and the discharge end current End I for a plurality of electrodes A, B, and C calculated by the method described in FIG. 5 for the graph of FIG. 13. Referring to Table 4, when the polarization resistance (Rpola) value is lowered (A>B>C) due to the increased porosity and the improved ion conductivity, the discharge end current (End I) is increased (A<B<C).

While this invention has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

The invention claimed is:

1. A device for estimating a performance of a rechargeable battery for use as a fully assembled rechargeable battery, the device comprising:

a current sensor to measure a discharge current output from the rechargeable battery during a discharge period in which the rechargeable battery is discharged from a predetermined reference voltage with a constant voltage; and a control circuit to:

calculate a resistance change relationship depending on a State of Charge (SOC) change during the discharge period based on the predetermined reference voltage and a change of the discharge current depending on time passage, and generate a resistance value of each of a first resistance as a resistance due to a voltage drop of the rechargeable battery, a second resistance as a resistance generated as an ion is inserted into an active material of the rechargeable battery during the discharge period, and a third resistance as a polarization resistance generated by a movement of the ion in the rechargeable battery, based on the resistance change relationship according to the SOC change of the discharge period, verify that the rechargeable battery is usable as the fully assembled rechargeable battery based on the performance of the rechargeable battery during the discharge period by comparing the polarization resistance with a reference value to determine whether the polarization resistance is less than or more than the reference value, select the rechargeable battery as passing a performance index that is expected from the fully assembled rechargeable battery when the polarization resistance is less than the reference value, select the rechargeable battery as failing the performance index that is expected from the fully assemble rechargeable battery when the polarization resistance is more than the reference value, and control a discharger to discharge the rechargeable battery with a predetermined constant current to lower a voltage of the rechargeable battery to correspond to the predetermined reference voltage, wherein the polarization resistance corresponding to the performance index expected from the fully assembled rechargeable battery is calculated as the reference value.

2. The device of claim 1, wherein the control circuit, in the resistance change relationship depending on the SOC change during the discharge period, uses a resistance value of a starting point of the discharge period as the resistance value for the first resistance, calculates a resistance value at an end point of the discharge period as an upper limit value of the second resistance on an extending line connecting a first point corresponding to the resistance value of the discharge period and a second point where a resistance change ratio for the SOC change exceeds a first reference value in the resistance change relationship for the SOC change, and calculates the resistance value of the second resistance based on a difference of the upper limit value of the second resistance and the resistance value of the first resistance.

3. The device of claim 2, wherein the control circuit calculates the resistance value of the third resistance based on a difference of the resistance value of the end point of the discharge period and the upper limit value of the second resistance.

4. The device of claim 3, wherein the control circuit compares the resistance value of the third resistance with a second reference value to determine an output performance of the rechargeable battery.

5. The device of claim 1, further comprising a voltage sensor to measure a voltage of the rechargeable battery to be transmitted to the control circuit.

6. The device of claim 1, wherein, when the rechargeable battery is continuously discharged, the control circuit further uses the polarization resistance as an index for predicting an output performance at a discharge end time of the rechargeable battery.

7. The device of claim 1, wherein the polarization resistance of the rechargeable battery is inversely proportional to a porosity of a positive electrode of the rechargeable battery and is proportional to a porosity of a negative electrode of the rechargeable battery.

8. The device of claim 1, wherein the rechargeable battery passing the performance index is selected for use in an electric device that includes at least one of vehicles (EVs) and energy storage systems (ESSs).

9. A system for estimating a performance of a rechargeable battery for use as a fully assembled rechargeable battery, the system comprising:

a discharger to discharge the rechargeable battery from a predetermined reference voltage with a constant voltage;

a current sensor to measure a discharge current output from the rechargeable battery during a discharge period during which the rechargeable battery is discharged; and a control circuit to:

calculate a resistance change relationship depending on a State of Charge (SOC) change during the discharge period based on the predetermined reference voltage and a change of the discharge current depending on time passage, and generate a resistance value of each of a first resistance as a resistance due to a voltage drop of the rechargeable battery, a second resistance as a resistance generated as an ion is inserted into an active material of the rechargeable battery during the discharge period, and a third resistance as a polarization resistance generated by a movement of the ion in the rechargeable battery, based on the resistance change relationship according to the SOC change of the discharge period, verify that the rechargeable battery is usable as the fully assembled rechargeable battery based on the performance of the rechargeable battery during the discharge period by comparing the polarization resistance with a reference value to determine whether the polarization resistance is less than or more than the reference value, select the rechargeable battery as passing a performance index that is expected from the fully assembled rechargeable battery when the polarization resistance is less than the reference value, and select the rechargeable battery as failing the performance index that is expected from the fully assemble rechargeable battery when the polarization resistance is more than the reference value, wherein the polarization resistance corresponding to the performance index expected from the fully assembled rechargeable battery is calculated as the reference value, and wherein the discharger discharges the rechargeable battery with a predetermined constant current under a control of the control circuit to lower a voltage of the rechargeable battery to correspond to the predetermined reference voltage.

10. The system of claim 9, wherein the control circuit, in the resistance change relationship depending on the SOC change during the discharge period, uses a resistance value of a starting point of the discharge period as the resistance value for the first resistance, calculates a resistance value at an end point of the discharge period as an upper limit value of the second resistance on an extending line connecting a first point corresponding to the resistance value of the discharge period and a second point where a resistance change ratio for the SOC change exceeds a first reference value in the resistance change relationship for the SOC change, and calculates the resistance value of the second resistance based on a difference of the upper limit value of the second resistance and the resistance value of the first resistance.

11. The system of claim 10, wherein the control circuit calculates the resistance value of the third resistance based on a difference of the resistance value of the end point of the discharge period and the upper limit value of the second resistance.

12. The system of claim 9, wherein, when the rechargeable battery is continuously discharged, the control circuit further uses the polarization resistance as an index for predicting an output performance at a discharge end time of the rechargeable battery.

13. A method for estimating a performance of a rechargeable battery for use as a fully assembled rechargeable battery, the method comprising:

controlling, by a control circuit, a rechargeable battery to be discharged from a predetermined reference voltage with a constant voltage;

receiving, by the control circuit, a measuring value of a discharge current output from the rechargeable battery during a discharge period in which the rechargeable battery is discharged;

calculating, by the control circuit, a resistance change relationship depending on a State of Charge (SOC) change during the discharge period based on the predetermined reference voltage and a change of the discharge current according to time passage and generating a resistance value of each a first resistance as a resistance due to a voltage drop of the rechargeable battery, a second resistance as a resistance generated as an ion is inserted in an active material of the rechargeable battery during the discharge period, and a third resistance as a polarization resistance generated by a movement of the ion in the rechargeable battery, based on the resistance change relationship depending on the SOC change during the discharge period;

verifying, by the control circuit, that the rechargeable battery is usable as the fully assembled rechargeable battery based on the performance of the rechargeable battery during the discharge period by comparing the polarization resistance with a reference value to determine whether the polarization resistance is less than or more than the reference value, selecting, by the control circuit, the rechargeable battery as passing a performance index that is expected from the fully assembled rechargeable battery when the polarization resistance is less than the reference value;

selecting, by the control circuit, the rechargeable battery as failing the performance index that is expected from the fully assemble rechargeable battery when the polarization resistance is more than the reference value; and discharging, by a discharger under a control of the control circuit, the rechargeable battery with a predetermined constant current to lower a voltage of the rechargeable battery to correspond to the predetermined reference voltage, wherein the polarization resistance corresponding to the performance index expected from the fully assembled rechargeable battery is calculated as the reference value.

14. The method of claim 13, wherein the calculating of the resistance value includes:

calculating, by the control circuit, a resistance value of a starting point of the discharge period as the resistance value for the first resistance;

calculating, by the control circuit, the resistance value at an end point of the discharge period as an upper limit value of the second resistance and calculating the resistance value of the second resistance based on a difference of the upper limit value of the second resistance and the resistance value of the first resistance on an extending line connecting a first point corresponding to the resistance value of the starting point of the discharge period and a second point where a resistance change ratio for the SOC change exceeds a first reference value based on the resistance change relationship for the SOC change; and calculating, by the control circuit, the resistance value of the third resistance based on a resistance value of the end point of the discharge period and the upper limit value of the second resistance.

15. The method of claim 13, further comprising:

using, by the control circuit, the polarization resistance as an index for predicting an output performance at a discharge end time of the rechargeable battery when the rechargeable battery is continuously discharged.

\* \* \* \* \*